(12) United States Patent
Barnett et al.

(10) Patent No.: US 8,673,746 B2
(45) Date of Patent: Mar. 18, 2014

(54) AMMONIUM SULFIDE PASSIVATION OF SEMICONDUCTORS

(75) Inventors: Joel Myron Barnett, Austin, TX (US); Richard James William Hill, Austin, TX (US)

(73) Assignee: Sematech, Inc., Albany, NY (US)

( * ) Notice: Subject to any disclaimer, the term of this patent is extended or adjusted under 35 U.S.C. 154(b) by 238 days.

(21) Appl. No.: 13/086,009

(22) Filed: Apr. 13, 2011

(65) Prior Publication Data

US 2012/0264309 A1 Oct. 18, 2012

(51) Int. Cl.
*H01L 21/306* (2006.01)

(52) U.S. Cl.
USPC ............... 438/478; 257/E21.211; 438/758; 438/38

(58) Field of Classification Search
USPC ............... 438/570, 572, 758, 750, 38; 257/E21.407, E21.309
See application file for complete search history.

(56) References Cited

U.S. PATENT DOCUMENTS

| | | | | |
|---|---|---|---|---|
| 4,920,078 A | * | 4/1990 | Bagley et al. | 438/779 |
| 5,599,748 A | * | 2/1997 | Holloway et al. | 438/767 |
| 5,814,533 A | * | 9/1998 | Shakuda | 438/46 |
| 6,429,117 B1 | * | 8/2002 | Sudijono et al. | 438/627 |
| 6,924,218 B2 | | 8/2005 | Marsh et al. | |
| 8,003,430 B1 | * | 8/2011 | Lee | 438/85 |
| 2007/0262363 A1 | * | 11/2007 | Tao et al. | 257/288 |
| 2010/0065824 A1 | * | 3/2010 | Wang et al. | 257/24 |

OTHER PUBLICATIONS

Lee, Jong-Lam. "Sulfur doping of GaAS with $(NH_4)_2S_x$ solution." Journal of Applied Physics, vol. 85, No. 2, 807-811 (Jan. 15, 1999).
O'Connor et al. "$(NH_4)_2S$ passivation of high-k/$IN_{0.53}GA_{0.47}AS$ interfaces: A systemic study of $(NH_4)_2S$ concentration." ECS Trans., vol. 28, Issue 1, 231-238 (Apr. 2010).
Suyatin et al. "Sulfur passivation for ohmic contact formation to InAs nanowires." Nanotechnology, 18, 1-5 (2007).
Herman et al. "Hydrogen sulfide plasma passivation of gallium arsenide". Appl. Phys. Lett., 60 (6), 716-717 (Feb. 10, 1992).
Bove et al. "Sulfur doping of GaAS and GaInP grown by metalorganic molecular beam epitaxy using a hydrogen sulfide gaseous source." Appl. Phys. Lett., 58 (18), 1973-1975, (May 6, 1991).
Ho, et al., "Nanoscale doping of InAs via sulfur monolayers", Appl. Phys. Lett., 95, 072108 (2009).

* cited by examiner

*Primary Examiner* — Savitr Mulpuri
(74) *Attorney, Agent, or Firm* — Heslin Rothenberg Farley & Mesiti P.C.

(57) ABSTRACT

The present invention includes methods directed to improved processes for producing a monolayer of sulfur on the surface of a semiconductor. As a surface layer, it functions to passivate the surface; if annealed, it provides a doping element.

14 Claims, No Drawings

AMMONIUM SULFIDE PASSIVATION OF SEMICONDUCTORS

TECHNICAL FIELD

The present invention is directed towards an improved process for creating a sulfur monolayer on the surface of a semiconductor material.

BACKGROUND OF THE INVENTION

As semiconductor technology moves toward ever faster and smaller devices, new challenges arise. In particular, when contemplating devices that require shallow (<9 nm) defect-free extensions, conventional techniques fall short. Cluster implantation, plasma immersion ion implantation and solid phase epitaxial regrowth are known for sub-micron device fabrication, but their use to make nanoscale devices is problematic. Monolayer doping is attractive, but the known means for providing a monolayer are not. Solution passivation with ammonium sulfide on binary and ternary semiconductors is known, but the procedures described in the literature would require the use and disposal of industrial quantities of 20% aqueous $(NH_4)_2S_x$. Ammonium polysulfide and its precursor, ammonium sulfide, are toxic; both storage and disposal raise safety issues. Twenty percent aqueous ammonium sulfide and polysulfide must be stored under the most stringent conditions and, after use, must be disposed of by collection and off-site decontamination. Contact with acidifying substances in wastewater generates hydrogen sulfide, which is itself volatile, offensive and toxic. There is a general need for a process for producing a sulfur monolayer on a semiconductor, which process is practical on an industrial scale.

Although the use of solutions of ammonium polysulfide as low as 0.2% has been reported for passivating the surface of InAs nanowires to fabricate an ohmic contact [Suyatin et al. Nanotechnology 18, 105307 (2007)], in general, systematic studies of ammonium sulfide passivation of InGaAs [O'Connor et al. J. Appl. Phys. 109, 024101 (2011)] have suggested that the optimal concentration for that purpose was 10%. Similarly, U.S. Pat. No. 6,924,218 describes a 2:9 mixture of 20% ammonium sulfide and 30% aqueous ammonia for passivating the surface of an InAlAs Schlottky layer.

SUMMARY OF THE INVENTION

The present invention relates to an improved process for producing a monolayer of sulfur on the surface of a semiconductor. As a surface layer, it functions to passivate the surface; if annealed, it provides a doping element.

In one aspect, the invention relates to a method for passivating a IV or III-V semiconductor material. The method comprises exposing the surface of the semiconductor material to an aqueous solution of $(NH_4)_2S$ at a concentration between 0.001% by weight and 0.1% by weight.

In a second aspect, the invention relates to a method for making an n-region in a semiconductor comprising:
  (a) providing a IV or III-V semiconductor material substrate;
  (b) exposing the material to an aqueous solution of $(NH_4)_2S$ at a concentration between 0.001% by weight and 0.1% by weight to provide a semiconductor material having a surface layer of sulfur;
  (c) capping the surface layer of sulfur; and
  (d) annealing the semiconductor material having a capped surface layer of sulfur, whereby the sulfur diffuses into the semiconductor material.

DETAILED DESCRIPTION OF THE INVENTION

The use of ammonium sulfide and polysulfide for passivating III-V surfaces is known. However, such use in the past has been largely limited to the use of aqueous solutions containing about 10-20% ammonium sulfide or polysulfide. As noted above, 20% aqueous ammonium sulfide and polysulfide must be stored under the most stringent conditions and, after use, must be disposed of by collection and off-site decontamination. This adds greatly to the hazard and expense of using ammonium sulfide solutions for passivation. It has now been surprisingly found that passivation of semiconductor substrates suitable for nanometer scale devices can be carried out with an aqueous solution of $(NH_4)_2S$ at a concentration between 0.001% by weight and 0.1% by weight. This concentration is orders of magnitude smaller than previously thought possible, and it makes the storage and disposal of reagent much simpler. At that degree of dilution, standard sanitary sewers can be safely used for disposal.

The use of super-dilute solutions of ammonium sulfide allows the creation of a monolayer of sulfur, which in turn makes possible the fabrication of junctions of less than 10 nm dimension. It also avoids damage to the substrate, which occurs when ion implantation is employed to create sub-10 nm features. Moreover, the technique is readily adapted to non-planar structures, and the equipment and processing costs are lower than for ion implantation processes. The process of the invention is thus valuable in making sub-10 nm devices.

The semiconductors that are the substrates for the process of the invention are known in the art as IV and III-V semiconductors. Examples of common IV semiconductors are silicon, germanium and silicon-germanium. Examples of common III-V semiconductors are GaAs, InP, InAs, GaP, InGaAs, InAlAs, InAlGa and GaInP. Examples of other, less common binary and ternary III-V materials include: AlSb, GaSb, GaP, InSb, AlGaAs, GaAsP, InGaN. For some uses quaternary III-V materials, such as AlGaInP and InGaAsSb, can be employed. The binary semiconductors GaAs, InP, InAs, GaP and ternary and quaternary alloys of GaAs, InP, InAs and GaP are preferred. The InAs/GaAs ternary alloy can be characterized as $In_xGa_{1-x}As$ where x is the proportion of InAs and $_{1-x}$ is the proportion of GaAs. The most convenient substrate for $In_xGa_{1-x}As$ is InP. Since $In_xGa_{1-x}As$ with 53% InAs has the same lattice constant as InP, the combination leads to very high quality thin films, and $In_xGa_{1-x}As$ with 53% InAs is often called "standard InGaAs" without bothering to note the values of "$_x$" or "$_{1-x}$". Unless otherwise noted, the examples below employed the standard 53% InGaAs.

The ammonium sulfide solution employed in the processes described herein is an aqueous solution of $(NH_4)_2S$ at a concentration between 0.001% by weight and 0.1% by weight. In some embodiments, the aqueous solution contains 0.02±0.019% by weight of ammonium sulfide.

The ammonium sulfide solution may be optionally fortified by the addition of from 0.0001% by weight to 0.01% by weight of elemental sulfur. In some embodiments, the aqueous solution includes an additional 0.001±0.0009% by weight of sulfur. "An additional" amount of sulfur means an amount beyond the stoichiometric amount present as $(NH_4)_2S$. Presumably the additional sulfur is incorporated into ammonium polysulfide, so that the passivation solution in this case would comprise ammonium sulfide with a minor amount of ammonium polysulfide. As can be seen below, the presence of the ammonium polysulfide (or excess sulfur) is unnecessary for the passivation.

The sulfur monolayer created by the process described herein can be whatever thickness is desired. In most cases the desired thickness is from 5 Å to 50 Å. In some embodiments, it will be 10 Å to 20 Å thick. The sulfur monolayer can be left in place as a passivation layer, or the structure can be annealed to disperse the sulfur into the substrate and create an n-region of defined morphology. If the sulfur-coated substrate is to be annealed, it is advantageous to cap the sulfur to prevent its loss by vaporization during annealing. This ensures that substantially all of the sulfur that has been deposited diffuses into the substrate rather than only a portion thereof diffusing into the substrate.

The capping material may be any material typically used as a chemical barrier. Oxides or nitrides that can be conformally coated function in this capacity. The most common example is silicon nitride.

Annealing is commonly carried out in an inert atmosphere such as argon, at temperatures from 300° C. to 1100° C. In certain embodiments the temperatures are from 400° C. to 800° C. The expression "from 300° C. to 1100° C." means that the process is carried out either by maintaining any temperature between 300° C. and 1100° C. or by varying the temperature within that range.

EXAMPLES

The substrates used in the examples were standard InGaAs. The InGaAs surfaces were first degreased by dipping in acetone and rinsing with isopropyl alcohol. Surface oxide was then removed by a 30 second to 3-minute dip in aqueous HF (10:1 or 1000:1) at room temperature followed by a dip rinse in $H_2O$. Passivation was carried out at room temperature by dipping the substrate in ammonium sulfide solutions at the concentrations shown below for 5 minutes followed by a dip rinse in $H_2O$. In various experiments not shown, the dip time ranged between 1 minute and 15 minutes. Longer times, e.g. 30 minutes or 60 minutes could be employed, but for most purposes, there is no reason to do so. The sulfur was capped by physical vapor deposition (sputtering) of a 200 Å film of silicon nitride using a single crystal silicon target doped with phosphorus (99.999% purity) and a flow rate of argon 35 SCCM and nitrogen 36 SCCM at 300 W power at ambient temperature. The capped substrates were annealed under argon at 400° C. to 800° C. for 30 seconds.

The following examples are not construed as limiting and are offered by way of illustration. While the substrates used in all examples were standard InGaAs substrates, the specific substrate used in a given example may have come from a manufacturing run different from that of other examples.

Example 1

20% ammonium sulfide plus 13.3 g/L of sulfur

Example 2

20% ammonium sulfide

Example 3

1000:1 dilution=0.3 mL of solution from example 1 diluted in 300 mL distilled water=0.2 g/L of $(NH_4)_2S$ with 1.3 mg/L of additional sulfur

Example 4

10,000:1 dilution=0.3 mL of solution from example 1 diluted in 3 L distilled water=20 mg/L of $(NH_4)_2S$ plus 0.13 mg/L of sulfur

Example 5

1000:1 dilution=0.3 mL of solution from example 1 diluted in 300 mL distilled water=0.2 g/L of $(NH_4)_2S$ with 1.3 mg/L of additional sulfur

Example 6

1000:1 dilution=0.3 mL of solution from example 2 diluted in 300 mL distilled water=0.2 g/L of $(NH_4)_2S$ without additional sulfur

Example 7

10,000:1 dilution=0.3 mL of solution from example 1 diluted in 3 L distilled water=20 mg/L of $(NH_4)_2S$ plus 0.13 mg/L of sulfur

Example 8

10,000:1 dilution=0.3 mL of solution from example 2 diluted in 3 L distilled water=20 mg/L of $(NH_4)_2S$ without additional sulfur A comparison of examples is shown in Table 1:

TABLE 1

| Example # | Conc. of $(NH_4)_2S$ | Total dopant $(\times 10^{13})$ | $R_{sh}$ (ohm/sq) Hall | n $(1 \times 10^{12}$ cm$^{-2})$ | Mob (cm$^2$V$^{-1}$s$^{-1}$) |
|---|---|---|---|---|---|
| 1 | 20% | 3.49 | 104 | 23.4 | 2570 |
| 2 | 20% | 2.58 | 123.7 | 21.4 | 2360 |
| 3 | 0.1% | 6.2 | 64.6 | 36 | 2690 |
| 4 | 0.01% | 4.35 | 107.3 | 24.9 | 2340 |
| 5 | 0.1% | 2.75 | 115.2 | 20.0 | 2710 |
| 6 | 0.1% | 1.90 | 174.7 | 14.0 | 2550 |
| 7 | 0.01% | 1.47 | 187 | 13.6 | 2450 |
| 8 | 0.01% | 2.14 | 178.6 | 14.0 | 2490 |

When the substrate is analyzed by secondary atom mass spectrometry (SIMS), it is found that the sulfur concentration (in atoms/cm$^3$) is comparable for all four samples both at the surface and as a function of depth, all of them being $>10^{19}$ at the surface and dropping below $10^{17}$ by 100 nm depth.

While several aspects of the present invention have been described and depicted herein, alternative aspects may be affected by those skilled in the art to accomplish the same objectives. It should be understood that the present disclosure is to be considered as an exemplification of the principles of this invention and is not intended to limit the invention to the embodiments illustrated.

The invention claimed is:

1. A method for passivating a III-V semiconductor material comprising exposing said material to an aqueous solution of $(NH_4)_2S$ at a concentration between 0.001% by weight and 0.1% by weight, wherein said material is chosen from GaAs, InP, InAs, InGaAs, GaP and ternary and quaternary alloys of GaAs, InP, InAs and GaP, wherein said aqueous solution is free of elemental sulfur and ammonium polysulfide.

2. A method according to claim 1 wherein said aqueous solution contains 0.02±0.019% by weight of ammonium sulfide.

3. A method according to claim 1 wherein said aqueous solution additionally includes from 0.0001% by weight to 0.01% by weight of sulfur.

4. A method according to claim 3 wherein said aqueous solution additionally includes 0.001±0.0009% by weight of sulfur.

5. A method for making an n-region in a semiconductor comprising:
(a) providing a IV or III-V semiconductor material substrate;
(b) exposing said material to an aqueous solution of $(NH_4)_2S$ at a concentration between 0.001% by weight and 0.1% by weight to provide a semiconductor material having a surface layer of sulfur;
(c) capping said surface layer of sulfur; and
(d) annealing said semiconductor material having a capped surface layer of sulfur, whereby said sulfur diffuses into said IV or III-V semiconductor material.

6. A method according to claim 5 wherein said semiconductor material is chosen from Si, Ge, SiGe, GaAs, InP, InAs, GaP and ternary and quaternary alloys of GaAs, InP, InAs and GaP.

7. A method according to claim 5 wherein said material is InGaAs or GaAs.

8. A method according to claim 5 wherein said aqueous solution contains 0.02±0.019% by weight of ammonium sulfide.

9. A method according to claim 5 wherein said aqueous solution additionally includes from 0.0001% by weight to 0.01% by weight of sulfur.

10. A method according to claim 9 wherein said aqueous solution additionally includes 0.001±0.0009% by weight of sulfur.

11. A method according to claim 5 wherein said aqueous solution is free of elemental sulfur and ammonium polysulfide.

12. A method according to claim 5 wherein said surface layer of sulfur is capped with silicon nitride.

13. A method according to claim 12 wherein said capped surface layer of sulfur is annealed at a temperature from 300° C. to 1100° C.

14. A method according to claim 13 wherein said capped surface layer of sulfur is annealed at a temperature from 400° C. to 800° C.

* * * * *